US009815072B2

(12) United States Patent
Danner et al.

(10) Patent No.: US 9,815,072 B2
(45) Date of Patent: Nov. 14, 2017

(54) APPARATUS FOR DEPOSITING A THIN LAYER OF POLYMER RESIST ON A SUBSTRATE

(71) Applicant: 1366 TECHNOLOGIES, INC., Bedford, MA (US)

(72) Inventors: Guy M. Danner, Somerville, MA (US); Vladimir S. Tarasov, Somerville, MA (US); Peter E. Kane, Westwood, MA (US); Peter G. Madden, Burlington, MA (US); Holly G. Gates, Somerville, MA (US); Emanuel M. Sachs, Newton, MA (US)

(73) Assignee: 1366 Technologies Inc., Bedford, MA (US)

(*) Notice: Subject to any disclaimer, the term of this patent is extended or adjusted under 35 U.S.C. 154(b) by 277 days.

(21) Appl. No.: 14/349,087

(22) PCT Filed: Oct. 12, 2012

(86) PCT No.: PCT/US2012/059967
§ 371 (c)(1),
(2) Date: Apr. 2, 2014

(87) PCT Pub. No.: WO2013/056059
PCT Pub. Date: Apr. 18, 2013

(65) Prior Publication Data

US 2014/0255615 A1 Sep. 11, 2014

Related U.S. Application Data

(60) Provisional application No. 61/546,384, filed on Oct. 12, 2011.

(51) Int. Cl.
*B05B 17/04* (2006.01)
*B05B 5/03* (2006.01)
(Continued)

(52) U.S. Cl.
CPC .............. *B05B 5/001* (2013.01); *B05B 5/005* (2013.01); *B05B 5/087* (2013.01); *B05B 7/0012* (2013.01);
(Continued)

(58) Field of Classification Search
None
See application file for complete search history.

(56) References Cited

U.S. PATENT DOCUMENTS 3,000,752 A * 9/1961 Jackson .................. C23C 26/00 118/308
5,138,520 A * 8/1992 McMillan ........... C23C 16/4412 257/E21.01
(Continued)

FOREIGN PATENT DOCUMENTS

JP 63093366 4/1988
JP 04289046 10/1992
(Continued)

OTHER PUBLICATIONS

International Search Report and Written Opinion of the International Searching Authority, dated Dec. 14, 2012, or PCT/US2012/59967, to which the present application claims priority.

(Continued)

*Primary Examiner* — Binu Thomas
(74) *Attorney, Agent, or Firm* — Steven J. Weissburg, Esq.

(57) ABSTRACT

The present inventions relate to the formation of a thin polymer film on a substrate. Apparatus is described for transforming a solid polymer resist into an aerosol of small particles, electrostatically charging and depositing the particles onto a substrate, and flowing the particles into a continuous layer. Apparatus is further described for transforming solid resist into an aerosol of small particles by
(Continued)

heating the resist to form a low viscosity liquid such as is compatible with nebulization and applying the techniques of jet or impact nebulization and aerosol particle sizing to form the aerosol. A method is further described of using ionized gas to confer charge onto the aerosol particles and using a progression of charging devices establish an electric field directing the flow of charged particles to the substrate. The progression of charging devices and associated apparatus results in high collection efficiency for the aerosol particles.

15 Claims, 8 Drawing Sheets

(51) Int. Cl.

| | | |
|---|---|---|
| B05B 5/16 | (2006.01) | |
| B05B 7/00 | (2006.01) | |
| H01L 21/00 | (2006.01) | |
| B05B 5/00 | (2006.01) | |
| B05B 13/02 | (2006.01) | |
| B05B 5/08 | (2006.01) | |
| H01L 21/67 | (2006.01) | |
| H01L 21/677 | (2006.01) | |
| G03F 7/00 | (2006.01) | |
| B05D 1/06 | (2006.01) | |
| B82Y 10/00 | (2011.01) | |
| B82Y 40/00 | (2011.01) | |
| B05B 15/04 | (2006.01) | |
| B05D 1/04 | (2006.01) | |

(52) U.S. Cl.
CPC ............... *B05B 13/02* (2013.01); *B05D 1/06* (2013.01); *B82Y 10/00* (2013.01); *B82Y 40/00* (2013.01); *G03F 7/0002* (2013.01); *H01L 21/6715* (2013.01); *H01L 21/6776* (2013.01); *H01L 21/67109* (2013.01); *H01L 21/67115* (2013.01); *B05B 15/04* (2013.01); *B05D 1/04* (2013.01)

(56) References Cited

U.S. PATENT DOCUMENTS

| | | | | |
|---|---|---|---|---|
| 6,054,395 | A * | 4/2000 | Knappenberger | ...... H01J 9/025 118/300 |
| 6,349,668 | B1 * | 2/2002 | Sun | ............ B05B 5/03 118/723 E |
| 6,701,066 | B2 * | 3/2004 | Sandhu | ............... C23C 16/4481 392/386 |
| 2006/0102074 | A1 * | 5/2006 | Hatono | .................. C23C 24/04 118/663 |
| 2007/0116881 | A1 | 5/2007 | Terada et al. | |
| 2009/0104372 | A1 | 4/2009 | Duffy et al. | |
| 2010/0009093 | A1 | 1/2010 | Scott et al. | |
| 2013/0078387 | A1 * | 3/2013 | Kauppinen | ............... B05B 5/03 118/621 |
| 2015/0090178 | A1 | 4/2015 | Arvidson et al. | |

FOREIGN PATENT DOCUMENTS

| | | |
|---|---|---|
| JP | 06343904 | 12/1994 |
| JP | 2002126600 | 5/2002 |
| JP | 2003080124 | 3/2003 |
| JP | 2008198533 | 8/2008 |
| JP | 2009233484 | 10/2009 |
| WO | 2004068916 | 8/2004 |

OTHER PUBLICATIONS

Supplementary Search Report from the EPO dated Aug. 15, 2013, for European Patent Application No. 12840425.8, which claims priority to PCT/US2012/59967, to which the present application claims priority.
First Office Action from the State Intellectual Property Office of the People's Republic of China dated Oct. 9, 2015, for Chinese Patent Application No. 201280061213.4, which claims priority to PCT/US2012/59967, to which the present application claims priority.
Second Office Action from the State Intellectual Property Office of the People's Republic of China dated Aug. 31, 2016 for Chinese Patent Application No. 201280061213.4, which claims priority to PCT/US2012/59967, to which the present application claims priority.
Notification to Grant Patent Right for Invention from the State Intellectual Property Office of the People's Republic of China dated Feb. 4, 2017, for Chinese Patent Application No. 201280061213.4, which claims priority to PCT/US2012/59967, to which the present application claims priority.
Examination Report from the Taiwan Intellectual Property Office dated Feb. 9, 2017. The Taiwan Patent Application No. 101137898 claims priority to U.S. Appl. No. 61/546,384, to which the PCT application PCTUS2012/059967, of which the present application is the national phase, also claims priority.
Examination Report from the Taiwan Intellectual Property Office dated Feb. 18, 2016. The Taiwan Patent Application No. 101137898 claims priority to U.S. Appl. No. 61/546,384, to which the PCT application PCTUS2012/059967, of which the present application is the national phase, also claims priority.
Notification of Reasons of Refusal from the Japanese Patent Office dated Sep. 27, 2016 for Japanese Patent Application No. 2014-535922, which claims priority to PCT/US2012/59967, to which the present application claims priority.

* cited by examiner

APPARATUS FOR DEPOSITING A THIN LAYER OF POLYMER RESIST ON A SUBSTRATE

RELATED DOCUMENTS

This is the 35 U.S.C. §371 U.S. National Phase of Patent Cooperation Treaty application No. PCT/US2012/059967, entitled, Apparatus and Process for Depositing a Thin Layer of Resist on a Substrate, International filing date of Oct. 12, 2012, to which the benefit of priority is hereby claimed. The PCT application claims the benefit of U.S. Provisional application No. 61/546,384 filed on Oct. 12, 2011, entitled Apparatus and Process for Depositing a Thin Layer of Resist on a Substrate. The entire disclosure of each application mentioned above is hereby incorporated fully herein, by reference.

A PCT application, No. PCT/US2012/056769, designating the United States, filed Sep. 22, 2012, in the name of Emanuel M. Sachs, entitled, TECHNIQUES FOR IMPROVED IMPRINTING OF SOFT MATERIAL ON SUBSTRATE USING STAMP INCLUDING UNDER-FILLING TO LEAVE A GAP AND PULSING STAMP, which PCT application claims priority to U.S. Provisional Application No. 61/538,489 of the same title, filed on Sep. 23, 2011. The PCT application is referred to herein below as the PCT/US2012/056769 application and it and its associated priority provisional application is hereby fully incorporated herein by reference. A second PCT application, No. PCT/US2012/056770, designating the United States, filed on Sep. 22, 2012, in the names of Emanuel M. Sachs et al., entitled, METHODS AND APPARATI FOR HANDLING, HEATING AND COOLING A SUBSTRATE UPON WHICH A PATTERN IS MADE BY A TOOL IN HEAT FLOWABLE MATERIAL COATING, INCLUDING SUBSTRATE TRANSPORT, TOOL LAYDOWN, TOOL TENSIONING, AND TOOL RETRACTION, which PCT application claims priority to U.S. Provisional Application No. 61/538,542 of the same title, filed on Sep. 23, 2011. The second PCT application is referred to herein below as the PCT/US2012/056770 application and it and its associated priority provisional application is hereby fully incorporated herein by reference.

BACKGROUND

Certain processing schemes and architecture are disclosed in Patent Cooperation Treaty Application No: PCT/US2008/002058, entitled, SOLAR CELL WITH TEXTURED SURFACES, Filed: Feb. 15, 2008, in the names of Emanuel M. Sachs and James F. Bredt and The Massachusetts Institute of Technology, designating the United States of America, the National Phase of which is U.S. patent application Ser. No. 12/526,439, issued as U.S. Pat. No. 8,257,998 on Sep. 4, 2012, and also claiming priority to two provisional United States applications, No. U.S. 60/901,511, filed Feb. 15, 2007, and No. U.S. 61/011,933, filed Jan. 23, 2008. All of the PCT application, the U.S. patent, patent application, and the two US provisional applications are hereby incorporated fully herein by reference. The technology disclosed in these applications is referred to herein collectively as Self Aligned Cell (SAC) technology.

Certain additional processing methods and apparatus are disclosed in Patent Cooperation Treaty Application No. PCT/US2009/002423, entitled WEDGE IMPRINT PATTERNING OF IRREGULAR SURFACE, filed Apr. 17, 2009, in the names of Benjamin F. Polito, Holly G. Gates and Emanuel M. Sachs, and the Massachusetts Institute of Technology and 1366 Industries Inc., designating the United States of America, the National Phase of which is U.S. patent application Ser. No. 12/937,810, and also claiming priority to two provisional United States applications, No. U.S. 61/124,608, filed Apr. 18, 2008, and No. U.S. 61/201, 595, filed Dec. 12, 2008. All of the PCT application, the U.S. patent application, and the two US provisional applications are hereby incorporated fully herein by reference. The technology disclosed in the applications mentioned in this paragraph is referred to herein collectively as wedge imprint technology or wedging technology, although in some instances protrusions having shapes other than wedges may be used. The related applications are referred to below as the Wedging applications.

In brief, such wedge imprint technology includes methods. Patterned substrates with a specified texture for photovoltaic and other uses are made. As shown with reference to FIGS. 1, 2, 3, 4, and 5 and 6 of the Wedging Application, the substrates are made by impressing protrusions of a flexible stamp, upon a thin layer of resist material, which covers a substrate wafer. The stamp tool used is of a material (typically elastomeric) that is soft enough so that the tool deforms upon contact with the substrate or wafer upon which a coating of resist has been previously applied. The resist becomes soft upon heating and moves away from the locations of impression at the protrusions under conditions of heat and pressure, revealing regions of the substrate adjacent to the protrusion. (The resist can be heated before or after the protrusions contact the resist or both before and after, as well as during.) The substrate is then cooled with the stamp in place, and the stamp is removed, leaving regions of the substrate exposed under holes, from where the resist has been moved away. The substrate can be further subjected to some shaping process, typically an etching process. Exposed portions of the substrate are removed by an action, such as etching, and portions of the substrate that are protected by the resist, remain.

A typical substrate is silicon, and a typical resist is a wax or a mixture of waxes, resins and rosins. The stamp may be used over and over again. The protrusions of the stamp may be discrete, spaced apart, such as the pyramidal elements shown. Or, they may be extended, wedge shaped elements, such as shown in the wedging applications. Or, they may be a combination thereof, or any other suitable shape that can cause the resist material to move away from the original covering condition.

Thus, a stamp is used to pattern a resist layer on a workpiece, which is then subjected to a different shaping step, to shape the workpiece. The workpiece may then be used for photovoltaic, or other uses. Textures that can be provided to the workpiece include extended grooves, discrete, spaced apart pits, and combinations thereof, as well as intermediates thereof. Platen based techniques may be used for patterning the workpiece. Rough and irregular workpiece substrates may be accommodated by using extended stamp elements to insure that the shaped portion of the stamp contacts the surface of the workpiece. Methods described in the wedging application and above are referred to herein as wedge imprinting or wedging.

Thus it is often desirable to coat very thin films of polymers onto substrates. A particular set of applications discussed above is in the area of defining patterns, for example, in a polymeric resist, which then acts to block etching. A thinner film is helpful in defining smaller features. For example, for features of 2-5 microns, a film of less than 5 microns thick and typically less than 3 microns is desirable. Typically such thin polymer films are deposited as a polymer dissolved in an organic solvent or finely dispersed in a carrier liquid. A film of thickness greater than the desired polymer thickness is deposited and this film thins down to the desired thickness as the solvent or carrier fluid evaporates.

However, using solvents places a burden on the environment. Using solvent requires more expensive equipment within the factory: to provide a safe breathing environment for workers, to avoid and suppress fires, and to remove solvent from exhaust streams entering the external environment. Inherent in using a solvent or dispersion is the addition of a process step to dry the coating down to its final thickness, which adds complexity and cost to the process. Shipping cost is increased when using liquid materials with bulk far in excess of the functional polymer content, and shipping of hazardous solvents involves additional cost. Finally, the shelf-life of polymers dissolved in solvents or carried in a dispersion is often limited, thus causing logistical problems and waste.

Thus, it can be desirable to deposit a thin polymer film without using a solvent or carrier fluid. There is need for such a process and for apparatus to carry out such a process. These, and other objects of invention hereof will be readily understood with reference to the Figures of the Drawing, which are:

BRIEF SUMMARY

Figure 1:
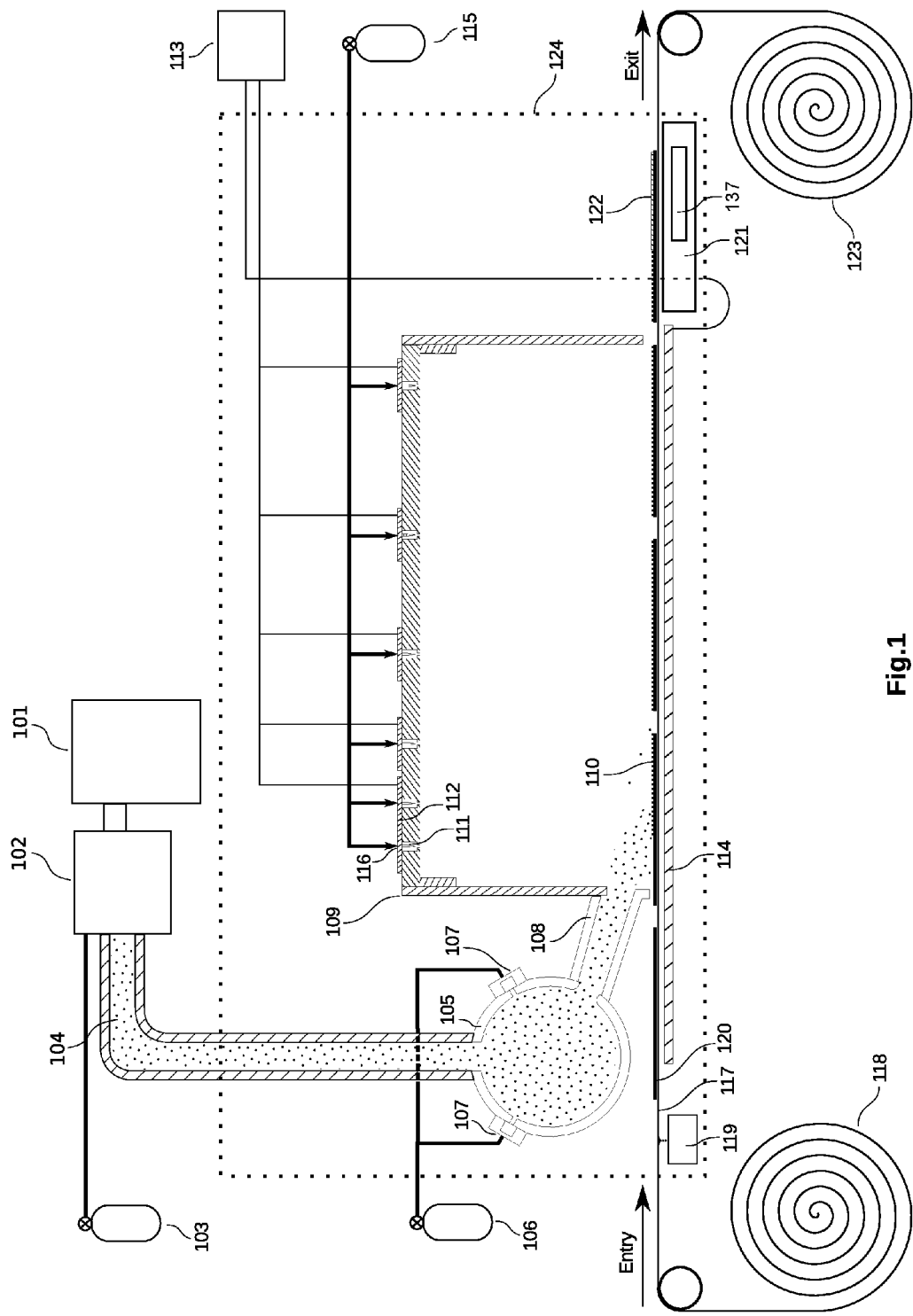
FIG. 1 is a block diagram and partial cross section view of one embodiment of an apparatus for electrostatic coating according to an invention hereof.

It is an aspect of inventions disclosed herein to use the polymer in a solid form, such as blocks, chunks or pails full of material. Material in this form can be provided by its manufacturer and shipped in that form to the user. The polymer is then rendered as small particles, of a size range comparable to and smaller than the thickness of the desired polymer layer. The particles are entrained in a flow of gas to form an aerosol and transported over the surface of the substrate to be coated. The particles are caused to deposit on the substrate with the aid of electrostatics. The layer of deposited particles is heated so as to flow into a film of polymer of the desired thickness and uniformity of thickness.

A useful method for creating the fine particles of polymer is to melt the polymer and to use nebulization techniques. In such cases, it is advantageous that the polymer can be heated to a point where the viscosity is fairly low, as this enables the use of nebulizer technology A useful method for electrostatically mediated deposition is to charge the polymer particles using ionized gas molecules. The charged resist particles are then attracted to the substrate by an established electric field, and the particles stick to the substrate.

It is desirable to collect all, or virtually all of the polymer particles onto the substrate. This makes for a more economical utilization of the polymer and it also minimizes cost and complexity of dealing with effluent streams containing fine particles. In addition, efficient deposition ensures that no polymer is available to be deposited on surfaces of the machine where it is not desired. This may be, for example, accomplished by providing a succession of charging devices along the length of a substrate support carrying the substrates to be coated. Successive charging devices can then address the particles that were not captured onto the substrate by previous charging devices with the result that very high deposition efficiencies can be attained.

The substrates to be coated can be carried on a paper belt. The paper belt provides a surface that captures particles deposited beyond the substrate border and between substrates which are advancing into the deposition zone. This paper belt may then be disposed of. Electrical contact to the underside of the substrate may be made through the belt by applying a small amount of water to the belt to establish a conductive path to a metallic plate below. The paper belt provides a protective cover for the underside of the substrate preventing deposition from occurring on that surface.

DETAILED DESCRIPTION

It is desired to deposit the polymer material by first creating an airborne particle form of the polymer or aerosol, which can be accomplished by a variety of methods. In order to create thin layers it is desirable to create very fine particles and to avoid the deposition of overly large particles. For example, consider the goal of creating a 2 micron thick layer of polymer. While a uniform, sparse coating of 100 micron particles could have the proper amount of material to form a 2 micron coating, the individual particles would be so far apart that they would not adequately flow to form a continuous layer of uniform thickness. At the other extreme, if every particle were smaller in size than the layer thickness and uniformly distributed over the surface of the substrate, then a continuous film of uniform thickness could certainly be made after flow. However, the inventors have found that the requirement on particle size is not as strict as this condition suggests. This is advantageous because higher volume flow rates of particles can be attained if somewhat larger particles can be used. It has been found that even as much as a majority of the particles can be of a size up to five times the desired layer thickness, as they do not form defects in the flowed film. However, it is preferable that the majority of particles be less than twice the desired layer thickness, and that the maximum size of particles in the aerosol should generally be limited to approximately five times the target film thickness in order to avoid forming non-uniformities in the coating which cannot be made level by the thermal flow step later in the process. Some particles larger than five times the desired film thickness can be tolerated, however, such particles may result in a locally higher film thickness even after flow and so, a majority of particles should be smaller than this threshold.

A suitable method for creating aerosol, developed and discussed below is jet nebulization, which when coupled with suitable filtering can produce a distribution of particle sizes from <1 micron to 10 micron. This range is suitable for the desired target film thickness of 2 microns of thermoplastic etch resist polymer. A disclosed embodiment is designed to uniformly apply to solar silicon wafer substrates.

Once the aerosol of solid polymer and entraining gas is obtained, it is desired to deposit the particles of the aerosol uniformly onto a substrate. A method that has been developed is to charge the particles with an ionized gas supplier and deposit the particles onto the substrate using an electric field.

Experience executing this process with several polymers has indicated that the process is flexible enough to deposit any fine particle aerosol that can be electrically charged, and is suitable for coating of thermoplastic polymer films in the thickness range of 0.1-10 microns with the preferred range of coating thickness able to be produced is 1-5 microns.

Overall Description

An embodiment of the apparatus that is an invention hereof for coating a thin layer of polymer from a solid source onto a substrate is shown schematically in FIG. 1. A thermoplastic polymer material, in this case an etch resist composed of waxes, resins, and rosins, that is solid at room temperature, is heated to a liquid state in the polymer supplier module 101. The polymer supplier provides periodic replenishment to the aerosol generator 102, as material is depleted through deposition. The aerosol generator uses a controlled source of aerosol generator gas from an aerosol generator gas supplier 103, which in a a preferred embodiment is a non-reactive gas that does not react with the resist. The aerosol generator gas is used to create fine, airborne particles of resist, called an aerosol 104, that are subsequently pushed into a distribution manifold 105 by the action of gas 103. As will be described subsequently, the aerosol generator relies on use of a polymer that can be transformed into a low viscosity liquid to create small diameter particles necessary for forming a thin, uniform coating layer. The particles in the aerosol in a preferred embodiment cool upon exiting the aerosol generator 102 to a sufficient degree that they become solid as they move through the distribution manifold. However, the particles are stable in aerosol form and could remain a liquid for a time sufficient to be deposited in the liquid state should that be a desired process.

Once created, the aerosol may be diluted using a secondary controlled supply of aerosol dilution gas from an aerosol dilution gas supplier 106. In a preferred embodiment, the aerosol dilution gas is supplied to the distribution manifold 105 through dilution gas introduction ports 107, however the aerosol dilution gas could be supplied at any point between the aerosol generator 102 and the coating chamber 109. In a preferred embodiment, the dilution gas is a non-reactive gas of the same type as provided by the aerosol gas supplier 103, but it may also be a different type of gas than that from the aerosol gas supplier and also from the ionizer gas supplier 115 to be discussed subsequently. An important function of the dilution gas is to maintain pressure in the distribution manifold and to create a uniform pressure over a narrow slot at the entrance to the delivery manifold 108. It is beneficial that the uncoated substrate is introduced to a High Efficiency Particle Accumulation (HEPA) process enclosure 124 that supplies clean gas, preferably air, into the process enclosure using a HEPA filter. The HEPA enclosure 124 maintains cleanliness and minimizes contamination that could cause subsequent process defects. The substrate proceeds into the coating chamber 109 along a first dimension and is conveyed by a substrate support 117 that can carry the substrate through the entire apparatus. The substrate support moves the substrate through the process as well as provides an overspray masking during the coating process. It is supplied from a substrate support unwind 118 and collected on a substrate support rewind 123. In order to achieve full coverage of the substrate, it preferred that the delivery manifold 108 is wider than the substrate to be coated 120 along a second dimension being approximately perpendicular to a first dimension.

Due to the size range of particles desired to achieve the target film thickness, it is advantageous to use electrostatics to produce the desired coating. The small particle size and low mass density lead to a very slow Stokes settling velocity, and the particles will not settle and deposit in the short time required for a useful apparatus. The particles are also easily carried by air currents and cannot be forced to deposit by air flow due to their low inertia. The use of electrostatics overcomes these issues. Therefore, a preferred coating process uses electrostatics to charge the aerosol introduced into the coating chamber by the delivery manifold and to subsequently deposit the charged particles in the aerosol onto the substrate 120. It is important, in order to form a thin, uniform coating layer, that the deposition of particles in this region be highly uniform as there is no simple way to significantly redistribute the coating mass over a macroscopic area after deposition. A corona discharge can be established by supplying high voltage from a high voltage generator 113 to corona electrodes 111 that are attached to and made electrically common by a corona electrode mounting plate 112. By flowing ionizable gas from the controlled ionizer gas supplier 115 through an ionizer gas introduction port 116, ionized gas, that can charge the aerosol 104 is introduced into the coating chamber 109. The high voltage generator 113 establishes an electric field between the corona electrode 111 and the counter electrode 114, causing charged ions and subsequently charged aerosol particles to follow the electric field lines toward the counter electrode.

The substrate 120 can be a conducting or semi-conducting material that can be held at an electrical potential close to that of the counter electrode by establishing electrical contact through the substrate support 117. In a preferred embodiment, inexpensive paper comprises the substrate support 117 and electrical contact can be established between the substrate 120 and the counter electrode 114 by applying a small amount of water from the conductivity enhancer dispenser 119 to establish a low resistance area on the substrate support. Because the substrate is held at a potential close to the counter electrode potential, charged aerosol particles follow the electric field lines and are collected on the substrate 120 as the substrate passes through the coating chamber 109. In a preferred embodiment, a silicon wafer for use in production of solar cells comprises the substrate. It is also possible for the substrate support be a loop of reusable medium that can be cleaned after deposition, such that the clean portion is directed to the apparatus entrance to be used repeatedly for additional substrates To form a continuous uniform film from the uniformly distributed collection of particles established as 110, the substrate and particle film are heated, causing the particles to melt, flow and fuse into a continuous layer. Because the target thickness of the final layer is ~2 microns, the flow process cannot significantly redistribute coating mass from the deposition process over a large area but merely fuse the material in place that has already been deposited. The temperature required for flow can be established by several methods, but is accomplished in a preferred embodiment in FIG. 1 by conductive heating through the substrate support. The flow stage 121 is held at a temperature sufficiently high, using a heater 137, to flow the resist layer into a continuous film coating 122, in this embodiment at a temperature of between about 40 C-about 90 C. The duration of exposure to the flow temperature may be established by the substrate support speed, the size of the flow stage, or a combination of both. Controlled vacuum distributed through the flow stage can be used to bring the substrate support and substrate into better thermal communication with the flow stage. The substrate continues out of the apparatus on the substrate support for further processing. Alternative methods of providing heat for flow include infrared heating, convection air heating, and laser heating. Infrared heating can be accomplished by a lamp source such that the lamp wavelength is absorbed by the substrate or resist material. Laser heating can similarly be accomplished with the source being a laser rather than an infrared lamp. Convection heating can be accomplished by having the substrate support pass through an oven with circulating air at the desired temperature.

It may also be desirable to cool the substrate upon completion of the flow process to harden the film for further processing, and this is accomplished in a preferred embodiment by passive air convection cooling. Alternative methods of cooling the substrate include providing additional chilled air convection cooling or by removing heat, using conduction to a cooling stage in a similar manner as the flow stage 121. In all cases, it may be desirable to have multiple zones of heating or cooling to provide the desired film properties. It is also possible to maintain the substrate at elevated temperature during the deposition itself such that deposition and flow are simultaneous by having the counter electrode be held at elevated temperature by one of the methods described above.

To increase throughput, the system could be fed with a higher output aerosol generator or from multiple aerosol generators operating in concert, which would allow substrates to be moved through the same coating chamber at a faster rate while receiving the same amount of coating. The entire apparatus could also be widened along a second dimension approximately perpendicular the travel of substrates along the first dimension, allowing multiple lanes of substrates to pass through a single coating chamber. Faster throughput could also be achieved by operating multiple coating chambers in series along the first dimension, such that each faster moving substrate would receive several depositions of particles to form the coating, which could be flowed after all depositions were completed.

An apparatus consisting of several coating chambers in series would also allow an alloyed polymer coating to be made by successive particle depositions of a first and a second, etc., polymer, followed by flow and fusion to form a film. An alloyed film could also be formed by mingling the output of two or more aerosol generators supplied with differing polymer feedstocks.

The methods described can be extended to create coatings that are composed of two or more layers of materials, including where the layers are of different materials and also possibly of different thickness. A first material may be deposited and flowed and then a second material may be deposited and flowed, including the possibility of flowing at a different temperature than that used for the first material. For example, the second material deposited may be capable of flowing at temperature lower than that required for the first material deposited. In such a case, the layers will remain quite distinct. If the materials have similar behavior during flow there may be some intermixing or diffusion between the materials during flow. In some case, blurring the interface between layers can be useful, for example in maximizing adhesion between layers. The two or more layers of material can also be deposited as particles and then flowed in a single flow step. This can lead to an increased intermingling of materials at the interface, which again, may be desirable; and it is more economical in production.

The utility of a multi-layer deposit, especially where different materials are used for the different layers, can be understood that in any given application, the deposited material must perform a variety of functions. For example, in an application where the polymer layer is a resist and it is to be patterned by the methods of the wedging application and then immersed in an etching solution, the layer should beneficially have excellent adhesion to the substrate, the appropriate characteristics of softening and flow as it is heated, must resist the acid and should be readily stripped at the end of the process, to name a few desired properties. A multi-material layer might use a lower layer that is particularly adhesive to a substrate and an upper layer that is particularly resistive to an acid etching, for example. Another desirable combination would be an adhesive lower layer and an upper layer with flow properties that prevent regions from denuding of resist. A lower layer that is more easily soluble in water and an upper layer that is more acid resistant would be another application.

Creation of Aerosol

It is desired to create a source of small particles of polymer material for subsequent charging, deposition, and flow as discussed below. The target size of particles is ~2 microns with a narrow distribution around this value, and nebulization is well suited to this task.

Nebulization produces many particles less than 5 microns. However, a polymer resist formulation that is solid at room temperature and compatible with forming patterns (for example through blocking etching) is not directly compatible with nebulization as used with water-based medication as a means of forming small particles. An aspect of an invention hereof is that some thermoplastic polymer resists composed of waxes, resins, and rosins can be suitably formulated such that by increasing the resist temperature the solid resist is caused to melt and form a liquid, upon further heating the polymer resist to a sufficiently high temperature, the viscosity of the liquid resist can be made to be less than 100 cP, thus enabling the material to be nebulized. It is an important aspect of an invention hereof that a solid material be made into a liquid with sufficiently low viscosity such that nebulization can effectively produce the required particles. In a preferred embodiment, the lowering of viscosity that is required for nebulization is accomplished without the addition of solvent or carrier fluid as the reduction in viscosity is accomplished solely by melting the resist into a liquid state. Thus, processes and apparatus of the inventions can be solvent-free, meaning that no solvent need be used. Appropriate viscosity is obtained by heating the resist to a temperature of 70-150 C.

Figure 2:
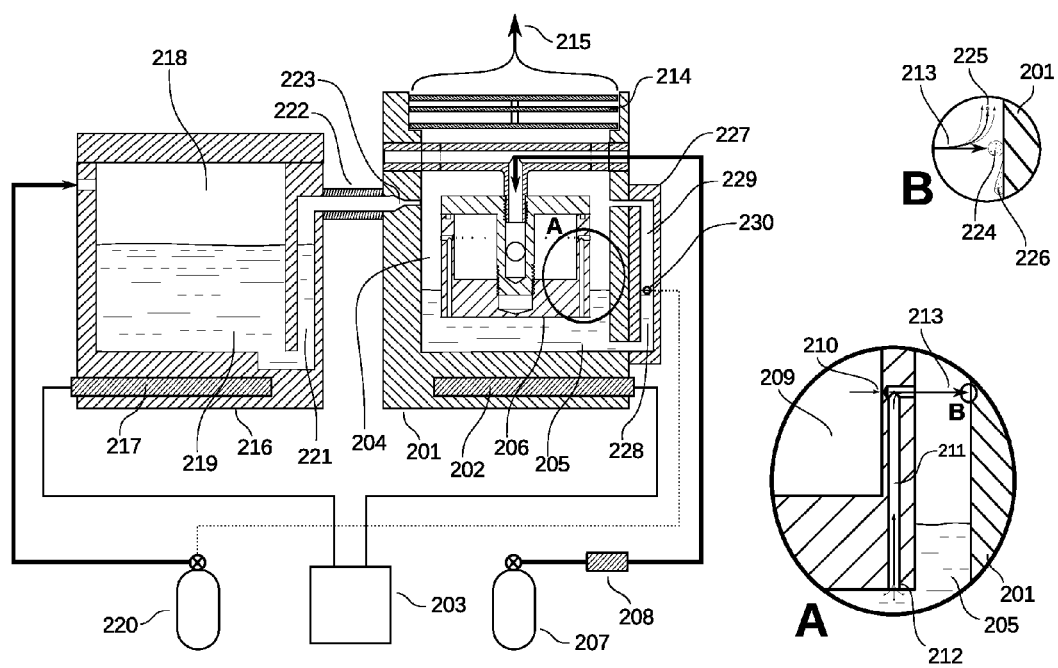
FIG. 2 is a block diagram and partial cross section view of one embodiment an apparatus for the resist heating, resist fluid delivery, and aerosol generation according to an invention hereof.

To deliver an appropriate volume of polymer-containing aerosol to the system, a preferred method is jet nebulization for generating particles (also referred to as impact nebulization). Because it is important that the polymer be a low viscosity liquid for nebulization, it is desirable that the apparatus maintain elevated temperatures for all surfaces in contact with the polymer, until after the aerosol is formed and the molten particles have cooled sufficiently to once again become solid (FIG. 2). The useful output of the assembly depicted in FIG. 2 is an aerosol as will be described subsequently, and the assembly may be referred to as an aerosol generator or nebulizer. A common term for the technology used for generating particles in this depiction is nebulization, and that term used to refer to the parts of the assembly that form the aerosol (206-209).

The operating principle of jet nebulization (detail A in FIG. 2) is that the liquid polymer 205, heated to realize a sufficiently low viscosity, is delivered to the vicinity of an orifice 210 from which a high pressure stream of gas emerges, breaking the fluid up into small droplets with a wide range of sizes of particles 213. The stream of gas from a controlled nebulizer gas supplier 207 is passed through a controlled gas heater 208 (described elsewhere) and is introduced to the nebulizer internal volume 209, from whence it can enter gas jet orifice 210.

The stream of particles 213 is directed at a solid surface 201, whereby the gas stream is caused to abruptly change direction (detail B FIG. 2). Large particles 224 with high momentum cannot change direction to follow the gas stream and are caused to impact on the solid surface. It is important that the impaction surface be maintained at elevated temperature to keep the polymer in a fluid state and deliver the impacted material to the bottom of the vessel for recirculation, as shown at 226. Small particles 225 with low momentum follow the gas stream and escape impaction on the solid surface. The gas stream with small particles passes through impactor plates 214 and becomes the aerosol 215, 104 to be delivered to the distribution manifold 105, 620.

The liquid polymer fluid can be delivered to the jet orifice in a preferred embodiment by Venturi suction developed by the exiting jet gas 210, which causes fluid to be collected from the liquid intake port 212 and pulled up the liquid uptake channel 211 into the jet orifice. It is desirable for the jetting orifice and channel to be made of a material that is a good thermal conductor, conveniently aluminum or stainless steel. The jetting orifice and channel are formed within the nebulizer body 206, also made from a thermally conducting medium.

The interior walls of the aerosol generator body 201 can be the solid surface for impaction. To deliver the required volume of particles for deposition, multiple jet orifice/channel pairs can be placed in a single vessel to increase the rate of delivery. FIG. 2 depicts a nebulizer body 206 with 24 jet orifice/channel pairs.

The aerosol generator body 201 can be maintained at an elevated temperature by heating element 202 in conjunction with thermal control system 203. The reduced viscosity melted polymer 205, the nebulizer body 206, and the impactor plates 214 can all be maintained at the same elevated temperature by the isothermal environment established by the surrounding walls of the temperature controlled aerosol generator body 201.

A polymer fluid should be delivered to replenish the aerosol generator vessel as material is depleted during deposition. This can be accomplished by several means. FIG. 2 illustrates liquid material 219 held in a separate polymer supply module body 216, desirably held at lower temperature than the aerosol generator by heating element 217 and thermal control system 203. Polymer fluid can be delivered to the nebulization vessel by briefly adding pressure from controlled pressurizing gas source 220 to polymer supply module internal volume 218, which forces the melted polymer up output riser 221, through supply channel 222 and supply orifice 223, and into the aerosol generator internal volume 204. There may be a check valve in the supply channel to prevent backflow, or the channel arrangement can use gravitational force on the fluid in the output riser to prevent backflow, as shown in a preferred embodiment of FIG. 2. It is important that the elements of the supply channels between the polymer supply module and the aerosol generator also be maintained at elevated temperature to keep the polymer in its liquid state. In the apparatus shown in FIG. 2, this is accomplished by conduction from adjacent thermally controlled masses 201 and 216 into supply channel 222. Alternatively, a continuous source of replenishment that exactly balances the loss from the aerosol generator to deposition may be provided by applying pressure to the polymer supply module internal volume with an appropriate flow restriction or an appropriate mass flow controller.

Alternatively, polymer material can be melted and maintained at a lower temperature (with resulting higher viscosity) and pumped through a heated, pressurized hose (for example a pail un-loader for hot glue). Alternatively, polymer can be maintained as a solid stick form and melted immediately before being delivered to the aerosol generator by pushing the stick through a melting orifice (for example a stick feed hot glue gun). Also, polymer material can be supplied by other methods known in the art.

It is important to maintain a constant nebulizer output to produce consistent coating thickness. A level detection system can accomplish this. The fluid in the level detection riser 228 is maintained at the same level as fluid in the aerosol generator internal volume 204 by fluid communication through an access hole, positioned at the bottom of both features. A hole at the top of the level detection body 227 allows gas pressure equilibration between the level detection gas channel 229 and the aerosol generator internal volume 204. This arrangement also prevents the turbulent liquid in the aerosol generator internal volume from disturbing the fluid level in the level detection assembly. The temperature of the level detection assembly is maintained by virtue of good thermal conduction from the aerosol generator body.

The level of fluid in the level detection riser can be monitored by an appropriate level detection sensor 230, in this embodiment a through beam laser sensor which relies on the difference in index of refraction between the polymer fluid and the gas. The sensor could also be mechanical or capacitive. The addition of new material to the aerosol generator from the polymer supply module is regulated by the signal from this sensor such that a constant fluid level is maintained in the aerosol generator during continuous operation for extended periods.

Figure 3:
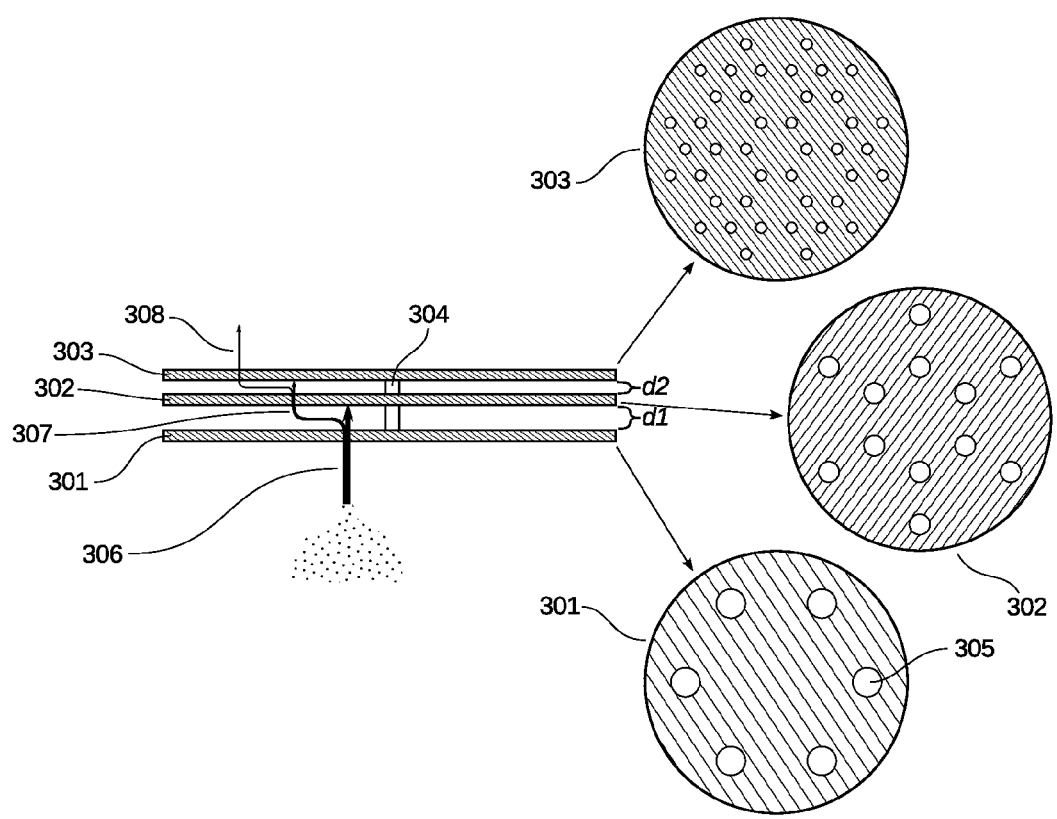
FIG. 3 is a block diagram and partial cross section view of one embodiment an apparatus of baffle plates for particle sizing and filtration of the aerosol according to an invention hereof.

Due to the high volume of jet gas and circulating liquid, occasionally a larger particle is created and escapes out of the nebulizer. This is undesirable, as it creates a local non-uniformity in the coating thickness. As discussed elsewhere in this text, it is not possible to flow such a thin layer sufficiently to absorb a large particle and achieve the desired film uniformity, so it is important that such large particles be removed from the aerosol. A series of impactor plates 214 prevents these large particles from escaping the aerosol generator (FIG. 3).

The first impactor plate 301 can consist of a metal plate with holes placed above the jetting orifice/channel area in the aerosol generator 201. A second impactor plate 302 with holes can be placed above the first plate, and the holes are not aligned with the first impactor plate. The wide particle size distribution aerosol 307 generated by the nebulizer is forced through a hole 305 in the first plate 301, and the stream is abruptly forced perpendicular to the original flow. Large particles impact on the second impactor plate and drain down as a liquid to be recirculated. Small particles follow the gas flow and are able to escape through the hole in the second impactor plate, giving rise to the smaller particle size distribution aerosol 307. A third impactor plate 303 can be added as an impaction plate for the second impactor plate, the output of which is the final particle size distribution aerosol 308. If an even smaller particle size distribution is desired, a fourth impactor plate can be added as an impaction plate for the third plate, and so on.

The hole size and inter-plate spacing can be varied to alter the size filtration characteristics of the baffle structure. The plates in a preferred embodiment can be held in position by a locking spindle 304. The spindle also sets the spacing from the first plate and the second plate (d1) and from the second plate to the third plate (d2). These distances are set to be approximately equal to the hole size in the relevant lower plate. In a preferred embodiment, the hole size in the first plate is 5.7 mm, with d1 also equal to 5.7 mm. The holes in the second and third plates are 3 mm, with d2 also being equal to this distance.

It is desirable to minimize the duration of thermal exposure of the polymer to avoid thermal degradation. By reducing the volume of liquid polymer surrounding the nebulizer body, the fluid is more rapidly depleted by deposition thus reducing total thermal exposure. In a preferred embodiment, the cylindrical plurality of orifice/channel pairs is placed in a well inside the aerosol generator body 201 that is also cylindrical and just slightly larger than the nebulizer body 206. The nebulizer body displaces most of the volume of the well, so only a small amount of liquid surrounding the nebulizer body is maintained. Channels are made between multiple shell/nozzles to maintain the same fluid height at all locations. Thermal exposure can further be reduced by maintaining the fluid 219 in the polymer supply module or other delivery system at a lower temperature than the working fluid 205 in the aerosol generator. The fluid can be delivered in small amounts such that it can be quickly heated and incorporated into the liquid in the bath.

The choice of gases and gas handling for jetting and particle delivery significantly impacts aerosol generation. Argon has a high density and creates more shear at the orifice. The higher shear results in an approximately two fold increase in the mass of particles delivered at the same temperature. The same would be true for any gas with high density. For reasons of lower operating cost, nitrogen can be used in a preferred embodiment. There is Joule-Thompson cooling of the gas exiting the jet orifice, which results in locally lower temperature at the jet orifice, increased resist viscosity, decreasing the effectiveness of shear in creating particles, and ultimately lower particle productivity. Preheating of the aerosol generator gas 208 offsets the Joule-Thompson effect by concentrating the heat exposure on the jetting orifice where low viscosity is required. Use of heated gas enables the bath to be maintained at lower temperature, reducing damage by oxidization at high temperature. Using a non-reactive gas as opposed to air also reduces oxidization.

The jet or impact nebulization is one technique for creating aerosols from low viscosity liquids. There are other methods known in the field of aerosols. Laskin (Laskin, S.: "Submerged Aerosol Unit", *A.E.C. Project Quarterly Report UR-45*, September, 1948 pp. 77-90, University of Rochester) describes a form of jet nebulizer with an orifice and liquid intake port, but the orifice/intake port are submerged beneath the liquid level. In this case the removal of large particles does not occur through impaction with a solid material but rather through collision with the interior walls of the gas bubbles from the jet gas. Small particles are released when the bubbles float to the surface and rupture. Babington (Babington, R. S., "Liquid Delivery Apparatus and Method for Liquid Fuel Burners and Liquid Atomizers", U.S. Pat. No. 4,573,904, issued Mar. 4, 1986) describes a nebulizer where a thin film of the liquid to be atomized is flowed over a spherical surface and a jet orifice is directed horizontally to cause the film to be broken into droplets. Impaction can be added to reduce the size distribution of particles made with such a spherical nebulizer. There are also concentric nebulizers (for example Tan, H. S., "Pneumatic Concentric Nebulizer with Adjustable and Capillaries", U.S. Pat. No. 5,884,846, issued Mar. 23, 1999) where the fluid to be nebulized and gas are flowed through concentric orifices such that the gas flow provides Venturi suction and breaks apart the fluid into small particles. Impaction can be added to reduce the sized distribution of particles made with such a concentric nebulizer. Finally, there are rotary type atomizers (for example Nyrop, J. E., "Liquid Atomizers", U.S. Pat. No. 2,902,223, issues Sep. 1, 1959; also Robisch, H., "Rotary Atomizer Spray Painting Device", U.S. Pat. No. 4,589,597, issues May 20, 1986) that form particles by accelerating a thin film or channel of fluid outward in a radial direction causing the resulting stream to break into droplets. The liquid flow rate and rotating speed among other factors determine the droplet size in this type of device.

Charging of Aerosol

Figure 4:
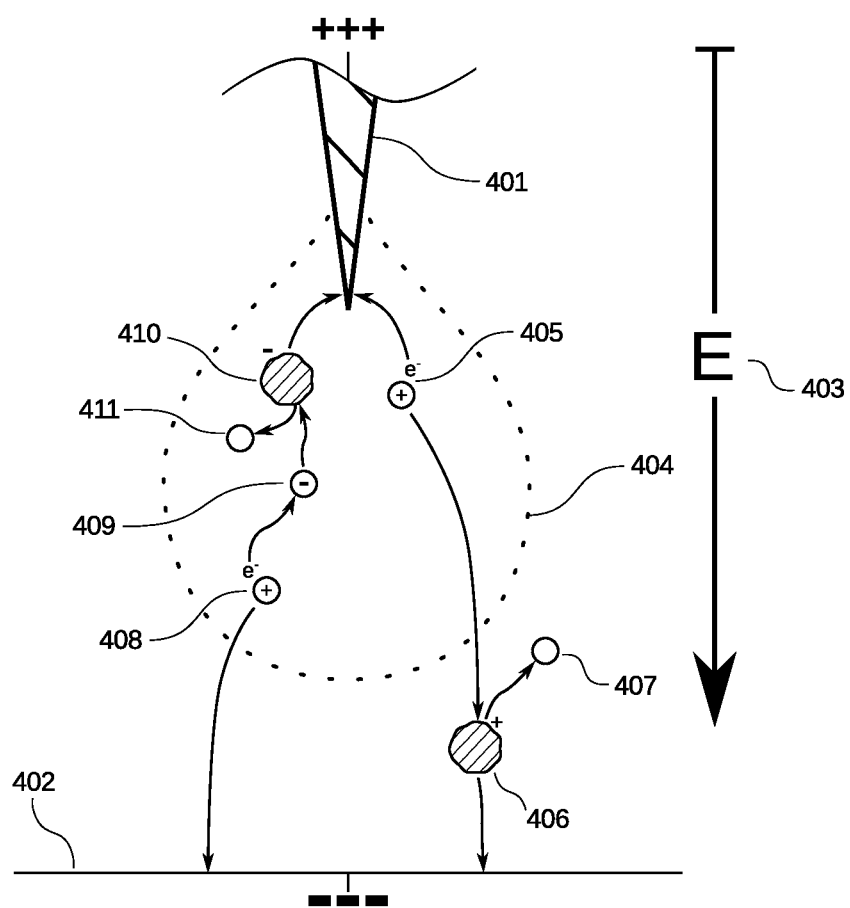
FIG. 4 is a schematic diagram showing a mechanism for creating ionized gas molecules and charging aerosol particles for one embodiment an apparatus according to an invention hereof.

Charging of the aerosol particles can be accomplished by transfer of charge from ionized gas as shown in FIG. 4. A high voltage source (typically ±30-120 kV, shown as positive in the diagram) is applied to a conducting corona electrode. A preferred embodiment is a corona point 401, though the source of corona ionization could also be a thin wire. The high voltage gradient near the corona electrode separates charge in a gas molecule 405, 408 shown as a gas ion and an electron. These ionization events can take place in an extended ionization region 404 surrounding each corona electrode.

Numerous types of interactions of ions and particles can take place in the coating chamber, but two interactions are important to the operation of the apparatus. In the first, positive charged ions created in the ionization region are attracted to the counter electrode 402. Polymer particles collide with the charged ion or several ions near the counter electrode, and charge is transferred to create a charged polymer particle 406 and a neutral gas molecule 407. Once charged, the particles follow the electric field 403 from the corona electrode to the counter electrode. The substrate (not shown in FIG. 4) is in electrical contact with the counter electrode, and deposition occurs when the charged polymer particle contacts the substrate.

In the second important interaction to consider, positive and negative charges separated in the ionized gas region 404, can move under the influence of the electric field 403. In the process described in the preceding paragraph, negative charges migrate toward the corona electrode 401 and are conducted away while positive ions migrate toward the counter electrode 402 where they charge aerosol particles prior to deposition. In the ionized gas region, it is also possible to create negatively charged gas ions 409 due to electrons colliding with a gas molecule prior to being conducted away by the corona electrode. Should an aerosol particle enter the mixed charge region where negative gas ions are present, it is possible to charge an aerosol particle negatively 410 after a collision with a negative gas ion 409 leaving a neutral gas molecule 411. The result is that the negatively charged particle is attracted to the corona electrode, ultimately resulting in contamination of the corona electrode. This contamination will accumulate and impair the performance of the charging system. Thus, it is to be avoided.

Figure 5:
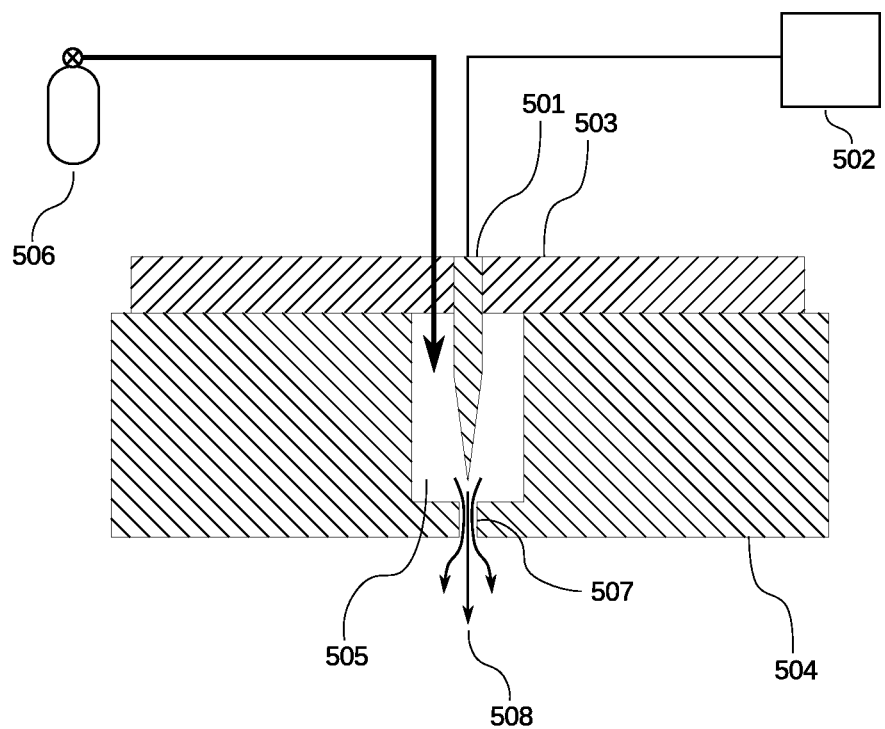
FIG. 5 is a block diagram and partial cross section view of one embodiment an apparatus for creating ionized gas molecules while simultaneously preventing corona electrode contamination according to an invention hereof.

An invention hereof (shown in FIG. 5) maintains the cleanliness of the electrode during continuous operation. The corona electrode 501 is shown attached to a conducting electrode mounting plate 503. A high voltage generator 502 is attached to the corona electrode and mounting plate. A controlled ionizer gas supplier 506 is attached to an entry port in the corona mounting plate (port not shown), which allows gas to flow into a corona gas cavity 505 around the corona electrode. The corona gas cavity is a space around one or more corona electrodes formed into a flat, non-conducting coating chamber lid 504. Ionizable gas flows into the corona gas cavity and out through the corona gas orifice 507 into the coating chamber. This apparatus performs at least two beneficial functions. The first is that the gas surrounding the corona electrode is determined by the ionizer gas supplier 506 and may be chosen for how easily it is ionized or other properties. The gas may also be chosen to be the same or different as other gases entering the chamber by other avenues, and the gas may be chosen for properties such as ease of ionization, electric breakdown strength, dielectric constant, or other properties beneficial to the process. The second function is that the corona gas cavity 505 is maintained at positive pressure relative to the coating chamber. The gas flow rate may be maintained such that a force is applied to expel particles that may have acquired a charge opposite from the intended charge and are attracted to the corona electrode. This function eliminates the contamination of the corona electrode and prevents impairment of the charging system.

An alternative to generating ions by establishing an electrical potential between the corona electrode 501 and a counter electrode 114,606 is to establish an electrical potential between the corona electrode 501 and an adjacent but electrically isolated surface. Such a surface can be placed in the region of the corona gas orifice 507 or the wall of the corona gas cavity 505 and can be a wire, ring, plate with orifice, or similar structure. The ionizer gas supplier 506 can flow gas through this high field region, generating ions as before, which are then forced into the coating chamber through the orifice 507.

Figure 8:
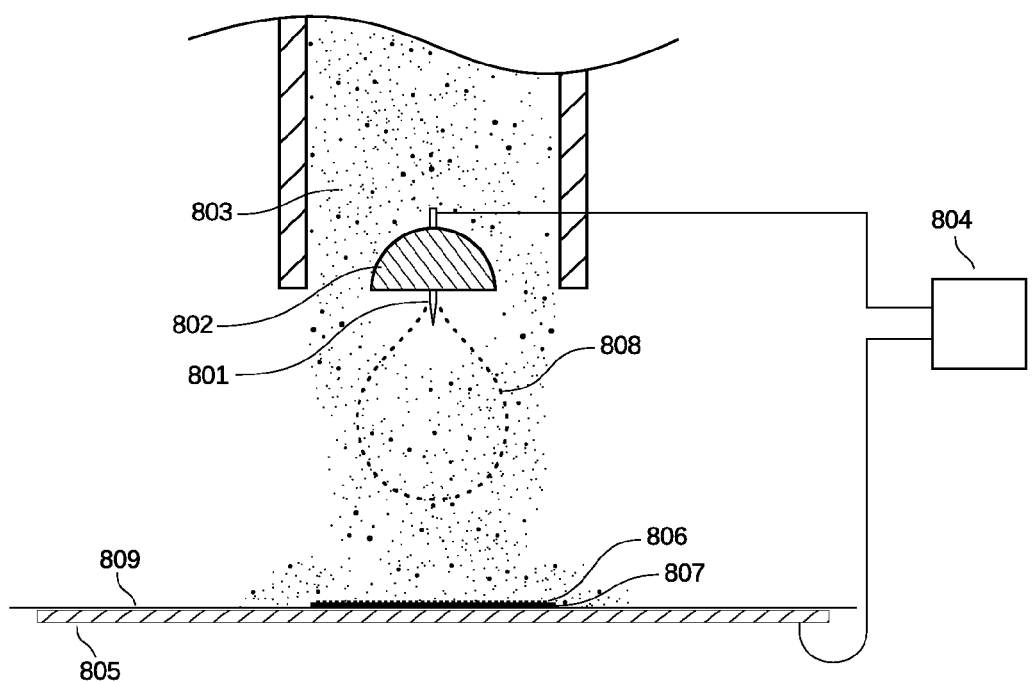
FIG. 8 is a block diagram and partial cross section view of one embodiment an apparatus for electrostatic deposition according to an invention hereof.

An alternative to providing ionized gas molecules from a remote corona electrode as described above, would be to use a corona electrode (wire, needle, or both) and gas flow such that the aerosol passes in the immediate vicinity of the corona electrode with no intervening gas layer as shown in FIG. 8. The aerosol 803 is provided as before and caused to flow into the vicinity of a corona electrode 801. A high voltage generator 804 provides an electrical potential between the corona electrode 801 and the counter electrode 805 sufficiently high as to cause ionization of the gas in the aerosol itself. The ionized gas region 808 comes into contact with the aerosol 803 and upon mixing imparts charge on the particles. To minimize contact between the corona electrode and wrong sign charged particles (since the aerosol enters the ionized gas region of mixed sign charge in this embodiment), a diffuser 802 is placed on the corona electrode to force the aerosol flow away from the electrode itself. This reduces but does not eliminate the electrode contamination issue. The correct sign charged particles then follow the electric field lines toward the counter electrode and form a particle layer 806 on the substrate 807. In this embodiment, the electric field would be maintained between the corona electrode as before, and particles acquiring the correct sign of charge would migrate towards the counter electrode to deposit on the substrate. The substrate is shown upon a substrate support 809, which functions similarly as in FIG. 1 to move the substrate through the apparatus and provide overspray protection. The substrate support may move the substrate continuously through the apparatus shown in FIG. 8 or may move to the position shown in the figure and stop for a fixed time during which deposition occurs. Flow and fusing of the particle layer may occur as described elsewhere.

Deposition Coating Chamber

Using the mechanisms for charging the aerosol described, the flow of charged aerosol is directed toward the substrate. A uniform deposition can be achieved by having a plurality of supplies of charged aerosol suitably arranged to provide uniform coverage to a stationary substrate. An alternative would be to cause a single or plurality of supplies of charged aerosol to move over the stationary substrate to provide uniform coverage of the substrate.

It is important to establish uniform delivery of aerosol particles across the substrate along a first direction in the direction of motion and along a second direction perpendicular to the first. A continuous, steady state flow of particles established in a stationary coating apparatus is a convenient method of accomplishing a uniform delivery of aerosol particles. It is also desirable to achieve the desired coating thickness with a minimum amount of resist material wasted to overspray or exhaust. As will be discussed subsequently, an extended collection area from a single, stationary source of particles is advantageous for achieving high collection efficiency.

Figure 6:
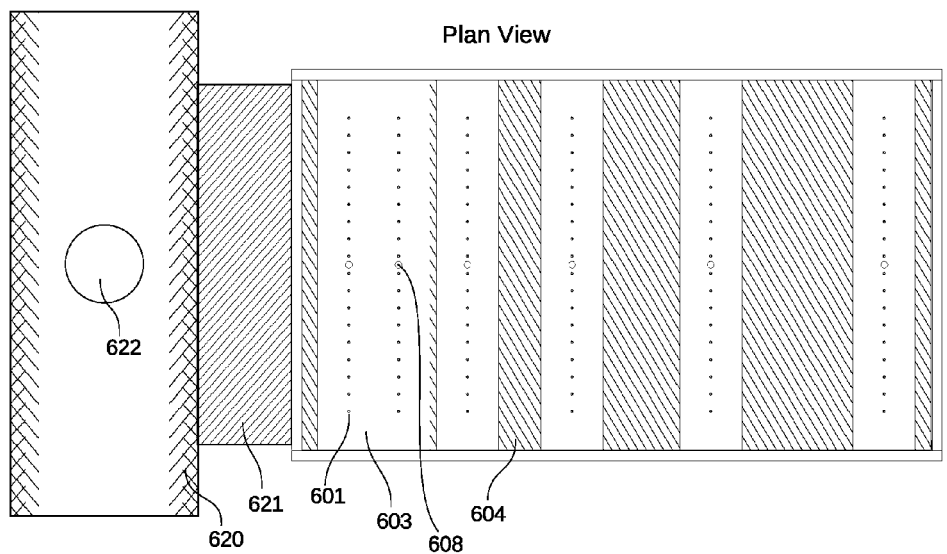
FIG. 6 is a block diagram and partial cross section view of one embodiment an apparatus for a high deposition efficiency coating chamber according to an invention hereof.
Figure 6:
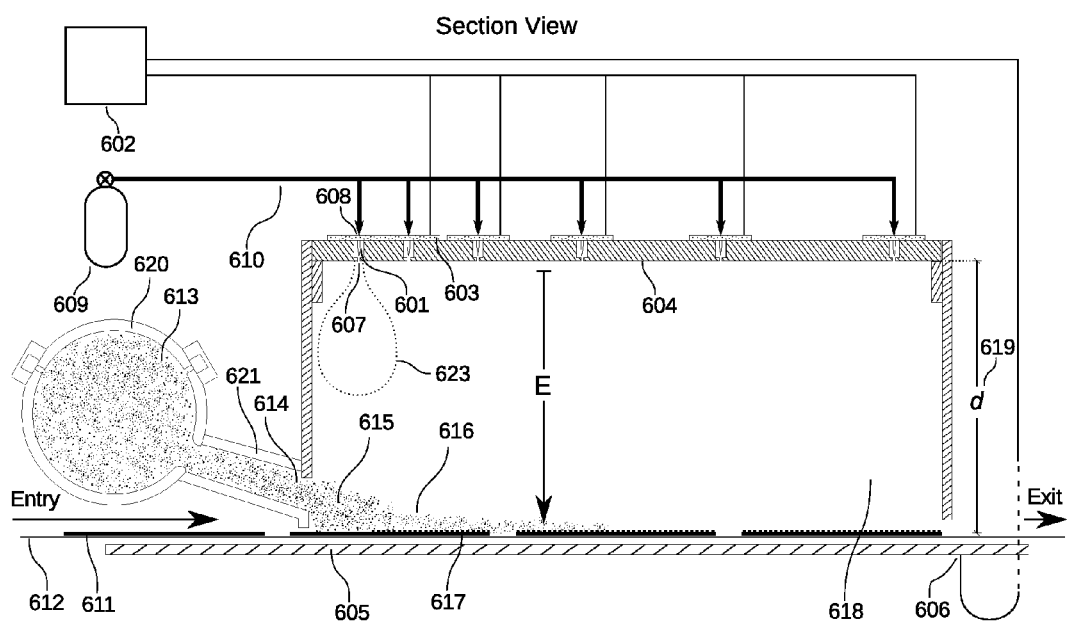

An invention hereof is a deposition coating chamber shown in FIG. 6. It is desirable to deliver particles uniformly along a second dimension appropriate to cover the width of the substrate 120,611 in the second dimension. To accomplish this, the particle aerosol is delivered through a tube into a large diameter distribution manifold 620 via aerosol inlet 622. The distribution manifold fills with aerosol 613 and creates a uniform pressure at the entrance to the delivery manifold 621. It is important that the distribution manifold be wider than the delivery manifold by some amount (approximately 2-20 cm on each side of the delivery manifold) to eliminate effects of airflow near the ends of the distribution manifold. It is important to deliver particles uniformly from a slot or orifice, that the slot or orifice be slightly wider than the desired coating width (the substrate width along the second dimension) so as to isolate non-uniform edge deposition effects outside the desired coating width. This is accomplished by making the delivery manifold 1-10 cm wider on each side than the desired coating width. It is advantageous to have the delivery manifold be narrow in a third dimension approximately perpendicular to the first and second dimensions so as to maintain adequate pressure across the delivery manifold and provide a constant rate of flow across the length of the delivery manifold. The width along the third dimension can depend on the rate of aerosol and gas flow, but in an embodiment 0.5-5 cm is preferred.

In a preferred embodiment aerosol in the delivery manifold 614 enters the coating chamber into a high density deposition zone 615. Charged ions are created as gas from a controlled ionizer gas supplier 609, flow through a corona gas connection point 608, past the corona electrode 601, and out through the ionizer gas orifice 607 creating an ionized gas region 623 in the coating chamber interior volume 618. The corona electrode is attached to a corona mounting plate 603, which is attached to a coating chamber lid 604. The ionized gas region 623 forms adjacent to and just below the coating chamber lid. As described above, in the ionized gas region there are mixed sign ions, which can charge aerosol particles with either sign. Outside the ionized gas region, only ions of a single sign migrate towards the counter electrode 605. It is desirable to have the aerosol be delivered in a region outside the ionized gas region so that all the aerosol particles are charged with only one sign of charge. The high density deposition zone 615 is a region where the aerosol from the delivery manifold 614 comes into contact with single sign ions and becomes charged, and achieves a high rate of deposition on the substrate 611 entering the deposition chamber. The aerosol shown in FIG. 6 enters the coating chamber from the same side that the substrate enters, but it may also be introduced from the middle or exit side of the chamber as may be appropriate to achieve a high rate of uniform deposition. It is desirable to achieve a rate of deposition in the high density deposition zone 615 that is steady in time so as to provide a uniform deposition across an individual substrate and between different substrates. This is achieved in part by providing sufficient ionization current to rapidly charge and deposit the aerosol upon exiting the delivery manifold 621. Another factor that can affect the steadiness of the rate of deposition is the rate of gas flow from the aerosol gas supplier 103 and dilution gas supplier 106 through the distribution manifold such that the flow can move particles forcefully out of the manifold. Another factor that can affect the steadiness of the rate of deposition is the rate of flow from the ionizer gas supplier 115,609 to provide appropriate ions for charging the aerosol.

To achieve a high degree of deposition uniformity in the deposition zone across the width of the delivery manifold, a preferred embodiment can have series of corona points with uniform spacing, all being connected to the high voltage generator 602. The corona points span the width of the coating chamber and the delivery manifold. The substrate enters the chamber on the substrate support 612 and is in electrical contact with the counter electrode 605, thus making it attractive to the charged particles, and achieving a high rate of deposition in the high density deposition zone. Some aerosol particles may escape the high density deposition zone, however, due to incomplete charging, turbulence, or other effect, and would have to be collected elsewhere resulting in considerable waste and expense. By introducing additional corona electrodes 601 farther away from the delivery manifold entrance along a first dimension, there is an opportunity to charge and capture additional aerosol particles in a lower density deposition region 616. Further, the structure of the coating chamber 109, being enclosed on all sides but for small openings for the substrate to enter and exit, confines the aerosol and ionized gas region. The chamber prevents uncharged aerosol from escaping, increasing the likelihood it will come in contact with charged ions and be deposited. Confining ions to the chamber prevents charge from accumulating on other surfaces such as the HEPA enclosure 124. Deposition 617 continues as the substrate moves away from the delivery manifold entrance, until virtually all aerosol particles have been captured. The high voltage generator 602 may provide a constant voltage between the corona electrode 601 and the counter electrode 606 that is steady in time or may provide a constant average voltage with a time varying component superposed on the component that is steady in time. This may be useful to improve the uniformity and stability of deposition. Applying the methods described previously, a uniformity sufficiently high to support a variety of applications can be achieved, typically 20% as defined by (maximum thickness−minimum thickness)/2 divided by the average thickness across the substrate.

Figure 7:
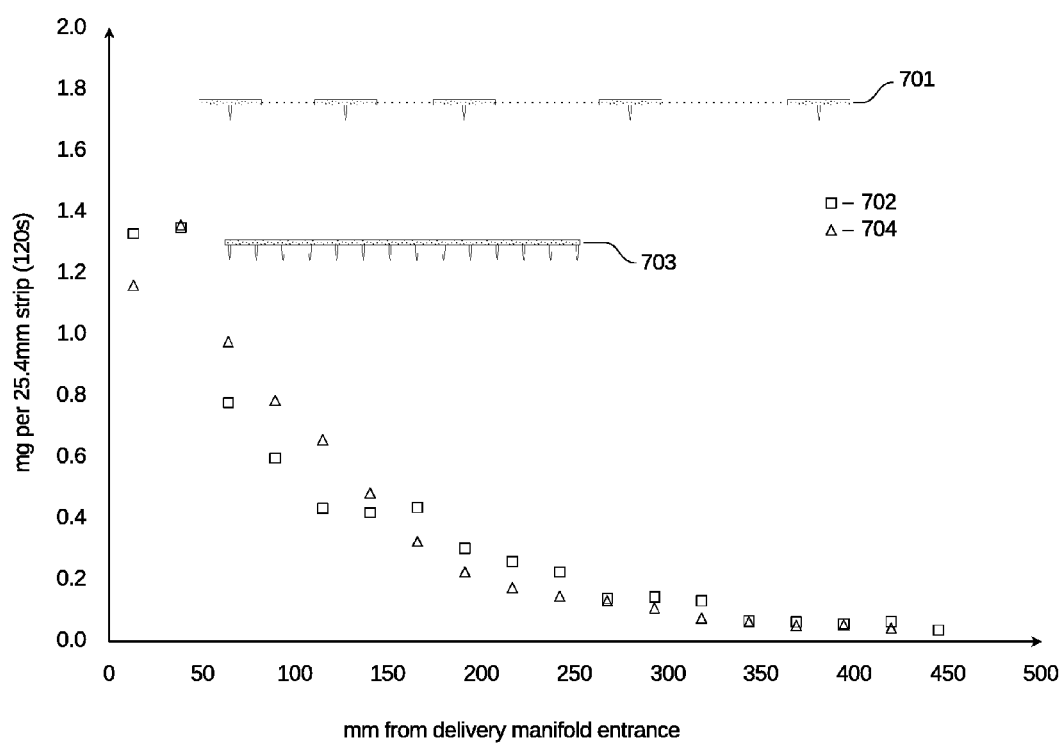
FIG. 7 is a graphical diagram showing the collection rate over the extended collection area of one embodiment of a high deposition efficiency coating chamber according to an invention hereof.

To test the collection efficiency of the apparatus described here, experiments were conducted, with the results shown in FIG. 7. The experiment was to place a series of metal strips on the counter electrode 605 inside the deposition chamber. For the purposes of the experiment, the substrate support 612 was removed and the strips were stationary. The strips covered the counter electrode of the deposition chamber across the width of the chamber along a second dimension and were narrow (~24.5 mm) along a first dimension down the length of the chamber. Strips were placed the entire length of the deposition chamber along the first dimension, and each strip was weighed prior to deposition and again after deposition for 120 seconds. The mass collected for each strip is plotted vs. the location of the center of the strip measured from the delivery manifold entrance. In one embodiment, rows of corona electrodes 601 were formed in the deposition chamber lid 604 as in FIG. 6. The approximate locations of the rows of corona electrodes 701 (as measured from the delivery manifold entrance) are depicted in the figure. The mass per strip collected with corona electrode rows is shown in open square symbols 702.

The mass per strip is highest near the delivery manifold entrance in the high density deposition region 615. The mass per strip decreases, moving into the lower density deposition zone 616, but polymer is still being collected in this zone. In another embodiment, a triangular lattice of corona electrodes was created on the electrode mounting plate, rather than rows. The approximate location of the corona array 703 is depicted in the figure. The mass per strip collected for the array embodiment is plotted with open triangle symbols 704. The results are similar to corona rows. In both cases it was observed visually that no particle aerosol emerged from the end of the deposition chamber, demonstrating that an extended set of corona electrodes results in virtually 100% collection efficiency.

This disclosure describes and discloses more than one invention. The inventions are set forth in the claims of this and related documents, not only as filed, but also as developed during prosecution of any patent application based on this disclosure. The inventors intend to claim all of the various inventions to the limits permitted by the prior art, as it is subsequently determined to be. No feature described herein is essential to each invention disclosed herein. Thus, the inventors intend that no features described herein, but not claimed in any particular claim of any patent based on this disclosure, should be incorporated into any such claim.

Alternatively, in certain embodiments, it is contemplated that the independent features can be combined in order to enjoy the benefits and advantages of each feature.

For instance, the following different features are each potentially separate from each other, and can be used alone, or in combination with any single other one or any subcombinations of the mentioned features: using a supply of solid polymer from which to generate an aerosol of particles; using a plurality of ionizers spaced apart from each other, so as to create ions at different locations relative to a substrate upon which they are deposited; keeping the substrate stationary, or moving the substrate, in particular, in a direction along which a plurality of ionizers are distributed; maintaining an ionizer in an ionizer gas cavity, which cavity can be provided with ionizer gas at a pressure to prevent any particles from entering the ionizer gas cavity; presenting an aerosol of particles to be ionized outside of an ionization zone, in which gas molecules are ionized, thereby preventing fouling of the ionizer electrode with charged particles; heating particles deposited upon a substrate to flow them into a thin layer; depositing particles that are smaller than five times a desired layer thickness; confining the target substrate, ionization zone and an aerosol of particles within a coating chamber, in which an electric field is also provided, to direct substantially all of the particles to a substrate, by virtue of the distributed nature of the ionizers and motion of the substrate past the plurality of distributed ionizers, all under the influence of the electric field; using a paper roll upon which to transport the moving substrate; wetting the paper roll to establish electrical conductivity to the substrate upon it; using different gasses for ionization gas and aerosol gas; using two or more different polymers to generate two or more different aerosols of particles, which may be intermixed before deposition upon the substrate, or which can be deposited upon the substrate in adjacent layers, which can be heated and flowed sequentially, or simultaneously, thereby establishing either an intermixed zone between the layers, or maintaining separation between layers; establishing different levels of electric field in the vicinity of different ionizers; spacing ionizers equally along the direction of motion of the substrate, or unequally; and providing the aerosol of particles at any location within the coating chamber relative to the direction of motion of a moving substrate.

Some assemblies of hardware, or groups of steps, are referred to herein as an invention. However, this is not an admission that any such assemblies or groups are necessarily patentably distinct inventions, particularly as contemplated by laws and regulations regarding the number of inventions that will be examined in one patent application, or unity of invention. It is intended to be a short way of saying an embodiment of an invention.

An abstract is submitted herewith. It is emphasized that this abstract is being provided to comply with the rule requiring an abstract that will allow examiners and other searchers to quickly ascertain the subject matter of the technical disclosure. It is submitted with the understanding that it will not be used to interpret or limit the scope or meaning of the claims, as promised by the Patent Office's rule.

The foregoing discussion should be understood as illustrative and should not be considered to be limiting in any sense. While the inventions have been particularly shown and described with references to preferred embodiments thereof, it will be understood by those skilled in the art that various changes in form and details may be made therein without departing from the spirit and scope of the inventions as defined by the claims.

The corresponding structures, materials, acts and equivalents of all means or step plus function elements in the claims below are intended to include any structure, material, or acts for performing the functions in combination with other claimed elements as specifically claimed.

Aspects of Inventions

The following aspects of inventions hereof are intended to be described herein, and this section is to ensure that they are mentioned. They are styled as aspects, and although they appear similar to claims, they are not claims. However, at some point in the future, the applicants reserve the right to claim any and all of these aspects in this and any related applications.

1. An apparatus for depositing a layer of polymer, which is solid at room temperature, the layer having a specified thickness, on a substrate, the apparatus comprising:
   a. a solid polymer supplier;
   b. a first heater, coupled to the polymer supplier, and configured to melt solid polymer to become liquid;
   c. an aerosol supplier of an aerosol of particles that can be formed from the liquid polymer, the majority of the particles being smaller in size than five times the specified thickness;
   d. a supplier of ionized gas molecules, designated below as an ionizer;
   e. the aerosol supplier and the ionizer being arranged so that the ionized gas molecules and the aerosol particles can be brought into proximity, such that at least a portion of the particles can become charged;
   f. a substrate support, upon which a substrate can be supported;
   g. an electric field generator, at which an electric field can be generated that can direct charged particles to a substrate upon the substrate support; and
   h. a second heater, at which a substrate supported by the substrate support can be heated to a degree that softens particles in contact with the substrate, to a degree that the particles fuse and form a polymer layer having the specified thickness.

2. The apparatus of aspect 1, further comprising at least one additional ionizer, spaced from the first ionizer along a first dimension, so that all of the ionizers constitute a plurality of ionizers.

3. The apparatus of aspects 1 or 2, further comprising a coating chamber coupled to the aerosol supplier and the ionizers, so that the ionized gas molecules and the aerosol particles can be maintained in proximity, such that substantially all the particles can become charged.

4. The apparatus of any of aspects 1-3, the substrate support comprising a moveable support, which can move along the first dimension, the electric field being large enough in magnitude to direct charged particles to a substrate and located downstream along the first dimension, with respect to motion of the movable support, of at least two of the ionizers.

5. An apparatus for depositing particles on a substrate, the apparatus comprising:
   a. an aerosol supplier of an aerosol of particles;
   b. a plurality of suppliers of ionized gas molecules, designated below as a plurality of ionizers, arrayed along a first dimension;
   c. a coating chamber coupled to the aerosol supplier and the ionizers, so that the ionized gas molecules and the aerosol particles can be maintained in proximity, such that substantially all the particles can become charged;

d. a movable substrate support, upon which a substrate can be placed and moved, along the first dimension; and e. an electric field generator, at which an electric field can be generated that can direct charged particles to a substrate upon the substrate support, the electric field being large enough in magnitude to direct charged particles to a substrate and the field being located downstream along the first dimension, with respect to motion of the movable support, of at least two of the ionizers.

6. The apparatus of aspect 5, further comprising:

a. a solid polymer supplier, configured to retain polymer material that is solid at room temperature; and b. a first heater, coupled to the polymer supplier, and configured to melt solid polymer to become liquid.

7. The apparatus of aspect 6, further wherein the particles are formed into a polymer layer on the substrate having a thickness of less than or equal to a specified thickness; the apparatus further comprising:

a. a supplier of an aerosol of particles which can be formed from the liquid polymer, the majority of the particles being smaller in size than five times the specified thickness;

b. a second heater, at which a substrate supported by the substrate support can be heated to a degree that softens any particles in contact with the substrate, to a degree that the particles fuse and form a polymer layer having the specified thickness.

8. The apparatus of any of aspects 4 and 7, further comprising a cooling stage, at which any melted polymer solidifies. ASPECTS ONLY.

9. The apparatus of aspect 8, the cooling stage operating at between about 10 Deg. C. less than room temperature and about 10 Deg. C. greater than room temperature.

10. The apparatus of any of aspects 1-4 and 7-9, the specified layer thickness being between approximately 0.1 microns and approximately 10 microns.

11. The apparatus of any of aspects 1-4 and 7-9, the specified layer thickness between approximately 1 microns and approximately 4 microns.

12. The apparatus of any of the preceding aspects, the substrate comprising a planar surface.

13. The apparatus of any of the preceding aspects, the substrate comprising a silicon wafer.

14. The apparatus of any of aspects 1-3 and 7-13, the layer of softened particles having a layer with a (maximum minus minimum)/2 thickness variation of less than about +/−20% from an average.

15. The apparatus of any of the preceding aspects, at least one ionizer comprising a corona point charger.

16. The apparatus of aspect 15, further comprising, adjacent the point charger, a diffuser.

17. The apparatus of any of aspects 1-15, at least one ionizer comprising an extended corona charger.

18. The apparatus of aspect 17, the extended corona charger comprising a wire.

19. The apparatus of aspect 17, the extended corona charger comprising a plurality of corona points spaced apart along a second dimension, which is approximately perpendicular to the first dimension.

20. The apparatus of any of aspects 2-14 and 17-19, the plurality of ionizers comprising discrete devices that are spaced apart along the first dimension.

21. The apparatus of any of aspects 2-14 and 17-19, the plurality of ionizing devices comprising a continuous device that extends along the first dimension.

22. The apparatus of any of aspects 4-21, the movable support comprising paper.

23. The apparatus of any of aspects 4-22, the movable support arranged to transport a substrate along the first dimension such that an entire substrate passes adjacent each ionizer.

24. The apparatus of aspect 23, the ionizers being arranged with a first and at least one additional ionizer along the first dimension, the aerosol supplier arranged to provide aerosol particles to the substrate near to the first ionizer.

25. The apparatus of any of aspects 4-24, the coating chamber housing at least a portion of the movable substrate support, the ionizers, and a port coupled to the aerosol supplier, such that aerosol particles can be provided within the coating chamber.

26. The apparatus of any of aspects 2, 5-14 and 17-25, the ionizers being arranged such that an electric field between a respective ionizer and the substrate varies from one ionizer to another ionizer.

27. The apparatus of aspect 20 the ionizers being distributed unevenly along the first dimension, such that spacing between adjacent ionizers is less, nearer a location where aerosol is provided to the substrate.

28. The apparatus of any of the preceding aspects, each ionizer having associated therewith an ionization zone, further wherein the aerosol supplier is arranged relative to a respective ionizer such that particles can be brought into proximity with ionized gas molecules outside of the ionization zone.

29. The apparatus of any of the preceding aspects, the aerosol supplier configured to supply an aerosol gas, the ionizer configured to supply an ionizer gas that is different from the aerosol gas.

30. The apparatus of aspect 29, the ionizer gas comprising an inert gas.

31. The apparatus of aspect 29, the inert gas comprising argon

32. The apparatus of any of aspects 1-4, and 7-31, further comprising a second solid polymer supplier, a heater, coupled to the second polymer supplier and an aerosol supplier of an aerosol of particles of a second polymer, all arranged so that aerosol of the second polymer particles can also be charged and directed to the substrate, softened and fused to form a polymer layer having the specified thickness.

33. The apparatus of aspect 32, the second aerosol supplier arranged to mix the second aerosol with the first aerosol, so that the polymer layer comprises fused particles of the first polymer and fused particles of the second polymer within a single layer.

34. The apparatus of aspect 32, the second aerosol supplier arranged to direct particles of the second aerosol to the substrate at a time and location after the particles of the first aerosol are directed to the substrate, so that a layer of the second polymer covers a layer the first polymer.

35. The apparatus of any of aspects 32-34, the first polymer and the second polymer differing from each other in composition.

36. The apparatus of any of aspects 32-34, the first polymer and the second polymer having the same composition as each other.

37. An apparatus for ionizing gas molecules in the presence of an aerosol of particles, the apparatus comprising:

a. a corona electrode;

b. a coating chamber comprising:

i. a lid comprising:

A. a chamber face and an obverse face, the corona electrode being mounted from the obverse face;

B. a corona gas cavity, into which the corona electrode extends, coupled to a corona gas orifice that passes from the corona gas cavity to the chamber face;
  ii. a cavity into which an aerosol of particles can be provided, into which the corona electrode does not extend;
c. a conduit that is coupled with the corona gas cavity, through which corona gas may be supplied at a velocity sufficient to prevent any particles from entering the corona gas cavity through the corona gas orifice; and
d. an electrical couple to the electrode, to which a voltage supply can be coupled, so as to establish a voltage at the electrode to create ions inside the corona gas cavity and, in concert with the corona gas, to expel the ions through the corona gas orifice.

38. A method for depositing a layer of polymer, which is solid at room temperature, the layer having a specified thickness, on a substrate, the method comprising:
a. providing a quantity of solid polymer;
b. heating the solid polymer so that it becomes liquid;
c. forming an aerosol of polymer particles from the liquid polymer, the majority of the particles being smaller in size than five times the specified thickness;
d. ionizing molecules of a gas, to generate ionized gas molecules;
e. bringing the ionized gas molecules into sufficient proximity with particles of the aerosol, so that at least some of the particles become charged;
f. providing a substrate upon a support;
g. generating an electric field and arranging and configuring the field to direct charged particles to the substrate upon the substrate support; and
h. heating the substrate to a degree that softens particles in contact with the substrate, to a degree that the particles fuse and form a polymer layer having the specified thickness.

39. The method of aspect 38, the step of ionizing molecules of gas comprising ionizing molecules of gas, with a plurality of ionizers at a plurality of locations, spaced apart from each other along a first dimension.

40. The method of any of aspects 38 and 39, the steps of bringing the ionized molecules into proximity with particles of aerosol being conducting in a coating chamber, such that substantially all of the particles become charged.

41. The method of any of aspects 38-40, further comprising the step of moving the substrate along the first dimension while directing the particles to the substrate, using an electric field that is large enough in magnitude to direct charged particles to a substrate and is located downstream along the first dimension, with respect to motion of the movable support, of at least two locations where the step of the particles becoming charged takes place.

42. A method for depositing particles on a substrate, the method comprising:
a. supplying an aerosol of particles in an aerosol gas;
b. using a plurality of electrostatic ionizers, arrayed along a first dimension, ionizing gas molecules of an ionizer gas to generate ionized gas molecules;
c. in a coating chamber, directing ionized molecules into proximity with particles of the aerosol, so that at least some of the particles become charged;
d. providing a substrate upon a movable support and moving the substrate along the first dimension; and
e. generating an electric field, that directs charged particles to the substrate, the electric field being large enough in magnitude to direct charged particles to a substrate and located downstream along the first dimension, with respect to motion of the movable support, of at least two of the ionizers, thereby depositing particles upon the substrate.

43. The method of aspect 42, the step of supplying an aerosol of particles comprising;
a. providing a quantity of solid polymer;
b. heating the solid polymer so that it becomes liquid; and
c. forming an aerosol of polymer particles from the liquid polymer.

44. The method of aspect 43, further wherein the particles are formed into a polymer layer on the substrate having a thickness of less than or equal to a specified thickness;
a. the step of forming an aerosol of polymer particles comprising forming an aerosol of particles, the majority of the particles being smaller in size than five times the specified thickness; and
b. further comprising the step of heating any particles in contact with the substrate, to a degree that the particles fuse and form a polymer layer having the specified thickness.

45. The method of any of aspects 38-41 and 44, the specified layer thickness being between approximately 0.1 microns and approximately 10 microns.

46. The method of any of aspects 38-41 and 44, the specified layer thickness being between approximately 1 microns and approximately 4 microns.

47. The method of any of aspects 38-46, the substrate comprising a planar surface.

48. The method of any of aspects 38-47, the substrate comprising a silicon wafer.

49. The method of any of aspects 38-41 and 44-48, the layer of softened particles having a layer with a (maximum minus minimum)/2 thickness variation of less than about +/−20% from an average.

50. The method of any of aspects 38-49, at least one ionizer comprising a corona point charger.

51. The method of any of aspects 38-49, at least one ionizer comprising an extended corona charger.

52. The method of aspect 51, the extended corona charger comprising a wire.

53. The method of aspect 51, the extended corona charger comprising a plurality of corona points spaced apart along a second dimension, which is approximately perpendicular to the first dimension.

54. The method of any of aspects 39-53, the plurality of ionizers comprising discrete devices that are spaced apart along the first dimension.

55. The method of any of aspects 41-54, the step of moving the substrate along the first dimension comprising moving the substrate such that an entire substrate passes adjacent each ionizer.

56. The method of any of aspects 41-55, the coating chamber housing at least a portion of the movable substrate support, the ionizers, and a port coupled to the aerosol supplier, such that the step of providing aerosol particles being conducted within the coating chamber.

57. The method of any of aspects 39-56, the step of providing an electric field comprising providing an electric field between a respective ionizer and the substrate, which field varies from one ionizer to another ionizer.

58. The method of any of aspect 39-57, the ionizers being distributed unevenly along the first dimension, such that spacing between adjacent ionizers is less, nearer a location where aerosol is provided to the substrate.

59. The method of any of aspects 39-58, ionization occurring at an ionizer, each ionizer having associated therewith an ionization zone, further wherein the step of bringing particles into proximity with ionized gas molecules is conducted outside of the ionization zone.

60. The method of any of the aspects 38-59 the step of ionizing gas molecules comprising ionizing molecules of a gas that differs from the aerosol gas.

61. The method of aspect 60, the ionizer gas comprising an inert gas.

62. The method of aspect 60, the ionizer gas comprising argon.

63. The method of any of aspects 38-41 and 44-62, further comprising providing an aerosol of a second polymer charging particles of the second polymer and directing them to the substrate, softening and fusing the particles of the second polymer to form a polymer layer having the specified thickness.

64. The method of aspect 63, the step of providing the second aerosol being conducted to mix the second aerosol with the first aerosol, so that the polymer layer comprises fused particles of the first polymer and fused particles of the second polymer within a single layer.

65. The method of aspect 63, the step of providing the second aerosol being conducted to provide the second aerosol to the substrate at a time and location after the particles of the first polymer are directed to the substrate, so that a layer of the second polymer covers a layer the first polymer.

66. The method of any of aspects 63-65, the first polymer and the second polymer differing from each other in composition.

67. The method of any of aspects 63-65, the first polymer and the second polymer having the same composition as each other.

The invention claimed is:

1. An apparatus for depositing a layer of polymer, which is solid at room temperature, the layer having a specified final thickness, on a substrate, the apparatus comprising:
   a. a solid polymer supplier;
   b. a heating element, coupled to the polymer supplier, and configured to melt solid polymer to become liquid;
   c. coupled to the polymer supplier and the heating element, an aerosol generator configured to form an aerosol of liquid particles from liquid polymer melted by the heating element, the majority of the liquid particles being smaller in size than five times the specified final thickness;
   d. a gas supplier of ionizable gas molecules, arranged to deliver ionizable gas molecules to an ionizer location;
   e. located at the ionizer location, a corona ionizer electrode;
   f. electrically coupled to the corona ionizer electrode, an electric field generator, configured to provide voltage to the corona ionizer electrode so as to ionize gas molecules delivered to the ionizer location;
   g. a delivery manifold coupled to the aerosol generator having an output arranged to deliver aerosol particles formed by said aerosol generator to a deposition zone where aerosol particles mix with ionized gas molecules so that particles of the aerosol of liquid particles are charged, the delivery manifold also being sized and located so as to extract heat from the liquid particles, so that the particles of the aerosol of liquid particles solidify as solid particles;
   h. a moveable substrate support, located adjacent the delivery manifold output, configured to move the substrate supported upon the substrate support along a first dimension, from the deposition zone to a flow stage, which is spaced from the deposition zone;
   i. a counter electrode, also coupled to the electric field generator, and located so that the substrate support is positioned between the counter electrode and the corona ionizer electrode;
   j. the electric field generator further configured to generate an electric field between the corona ionizer electrode and the counter electrode arranged to direct charged solidified particles to the substrate supported upon the substrate support; and
   k. a heater, located in the flow stage and thermally coupled to the substrate support, and configured to provide heat to said substrate support to soften and melt the solidified particles upon the substrate to form a continuous polymer layer having the specified final thickness.

2. The apparatus of claim 1, the gas supplier further arranged to supply ionizable gas molecules at least one additional ionizer location, spaced from said ionizer location along the first dimension, further comprising at each respective at least one additional ionizer location, a corona ionizer electrode so that all of the corona ionizer electrodes together constitute a plurality of corona ionizer electrodes.

3. The apparatus of claim 1, further comprising a coating chamber coupled to the aerosol generator and the corona ionizer electrode, so that the ionized gas molecules and the aerosol particles, mix such that substantially all the particles become charged.

4. The apparatus of claim 2, the moveable substrate support configured to move along the first dimension, the electric field generator further configured to generate the electric field between each ionizer electrode and the counter electrode, the electric field being configured to direct charged particles to the substrate located at the deposition zone and located spaced away along the first dimension.

5. The apparatus of claim 1 the specified final layer thickness being between approximately 0.1 microns and approximately 10 microns.

6. The apparatus of claim 1, the continuous polymer layer having a (maximum minus minimum)/2 final thickness variation of less than +/−20% from an average.

7. The apparatus of claim 1, the corona ionizer electrode comprising a corona point charger.

8. The apparatus of claim 1, the corona ionizer electrode comprising an spatially extended corona charger.

9. The apparatus of claim 8, the extended corona charger comprising a wire.

10. The apparatus of claim 8, the extended corona charger comprising a plurality of corona points spaced apart along a second dimension, which is approximately perpendicular to the first dimension.

11. The apparatus of claim 2, the plurality of corona ionizer electrodes comprising discrete devices that are spaced apart along the first dimension.

12. The apparatus of claim 2, the corona ionizer electrodes being arranged such that spacing along the first dimension between corona ionizer electrodes of the plurality of corona ionizer electrodes is unequal.

13. The apparatus of claim 1, the corona ionizer electrode having associated therewith an ionization zone, further wherein the aerosol supplier is arranged relative to the corona ionizer electrode such that particles mix with ionized gas molecules outside of the ionization zone.

14. The apparatus of claim 1, the aerosol generator configured to supply an aerosol gas, the supplier of ionizable gas molecules configured to supply ionizable molecules of a gas that is different from the aerosol gas.

15. The apparatus of claim 14, the ionizable gas comprising an inert gas.

\* \* \* \* \*